(12) United States Patent
Cho

(10) Patent No.: US 6,856,661 B2
(45) Date of Patent: Feb. 15, 2005

(54) USING PHASE INTERPOLATOR INFORMATION TO DETECT A LOSS OF LOCK CONDITION DURING RECOVERY OF A CLOCK SIGNAL FROM A RECEIVED DATA STREAM

(75) Inventor: James B. Cho, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 905 days.

(21) Appl. No.: 09/801,534

(22) Filed: Mar. 8, 2001

(65) Prior Publication Data

US 2002/0126786 A1 Sep. 12, 2002

(51) Int. Cl.$^7$ ............................................. H04L 25/00
(52) U.S. Cl. ...................................... 375/371; 327/291
(58) Field of Search ................................ 375/354, 371, 375/377; 327/233, 236, 291

(56) References Cited

U.S. PATENT DOCUMENTS

| | | | | |
|---|---|---|---|---|
| 5,418,822 A | * | 5/1995 | Schlachter et al. | 375/354 |
| 5,485,490 A | * | 1/1996 | Leung et al. | 375/371 |
| 5,925,093 A | * | 7/1999 | Yasuda | 708/313 |
| 6,094,082 A | * | 7/2000 | Gaudet | 327/270 |
| 6,122,336 A | * | 9/2000 | Anderson | 375/371 |
| 6,236,697 B1 | * | 5/2001 | Fang | 375/376 |
| 6,741,668 B1 | * | 5/2004 | Nakamura | 375/376 |
| 2002/0090045 A1 | * | 7/2002 | Hendrickson | 375/376 |

FOREIGN PATENT DOCUMENTS

JP       02001056723 A   *   2/2001

* cited by examiner

Primary Examiner—Jean B. Corrielus
(74) Attorney, Agent, or Firm—W. Daniel Swayze, Jr.; W. James Brady; Frederick J. Telecky, Jr.

(57) ABSTRACT

A loss of lock condition of a clock signal (25) recovered from a received data stream can be detected by examining conventionally available information (25, 26) indicative of a rate of change of an interpolation ratio according to which first and second phases of a local reference clock signal are combined to form the recovered clock signal.

20 Claims, 1 Drawing Sheet

USING PHASE INTERPOLATOR INFORMATION TO DETECT A LOSS OF LOCK CONDITION DURING RECOVERY OF A CLOCK SIGNAL FROM A RECEIVED DATA STREAM

FIELD OF THE INVENTION

The invention relates generally to data communications and, more particularly, to the recovery of a clock signal from a received data stream.

BACKGROUND OF THE INVENTION

Loss of lock (LOL) detection circuits are conventionally used in data communication transceivers to detect when a clock signal that is recovered from a received data stream deviates from a local reference clock frequency by more than a predetermined amount. The amount of the deviation is typically measured in parts per million (PPM). One known way to detect a loss of lock condition is to wait until the recovered clock and the local reference clock are phase aligned, and then measure how long it takes for a slip of one cycle to occur. This approach requires the following components: a circuit for detecting phase alignment of the clocks; two counters for keeping track of how many times each clock has cycled since the phase alignment; and a circuit for detecting when a slip of one cycle has occurred. Thus, if it is desired, for example, to implement a loss of lock detection circuit that can detect a 400 PPM deviation, the following components would be required: at least one phase detector; two counters that can count up to 2500 (because 400 PPM corresponds to a one cycle deviation in 2500 cycles); and control circuitry to indicate when phase alignment and cycle slip conditions occur. If it is desired to detect a 200 PPM deviation, this would require two counters that can count up to 5000 (a count of 5000 requires 13-bit counters), and the aforementioned phase detector and control circuitry.

It is therefore desirable to reduce the amount of circuitry required to implement a loss of lock detector, which would correspondingly reduce the space requirements and power consumption of the loss of lock detector.

The invention provides for detection of a loss of lock condition by examining conventionally available information indicative of a rate of change of an interpolation ratio according to which first and second phases of the local reference clock are combined to form the recovered clock. This use of already available information reduces the amount of circuitry required for loss of lock detection, and also provides for faster detection of a loss of lock condition.

DETAILED DESCRIPTION

Figure 1:
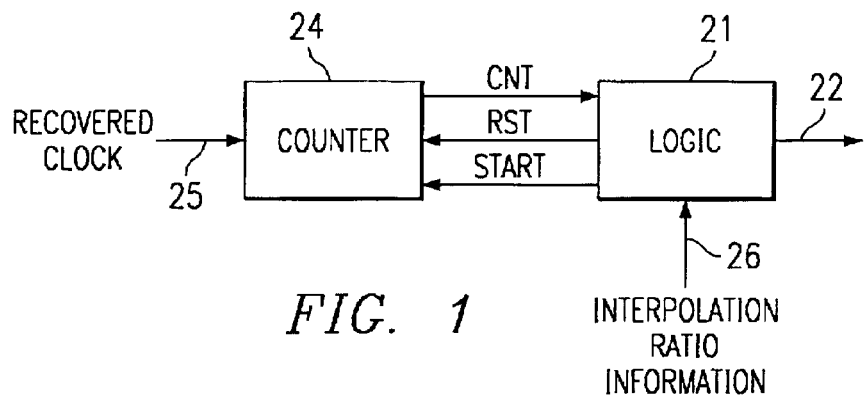
FIG. 1 diagrammatically illustrates exemplary embodiments of a loss of lock detector according to the invention.

FIG. 1 diagrammatically illustrates pertinent portions of exemplary embodiments of a loss of lock detector according to the invention. The loss of lock detector of FIG. 1 can be used on, for example, any suitable data communication transceiver chip, or clock and data recovery chip, that uses a phase interpolator to track an incoming serial data stream. Such use of a phase interpolator is common in conventional data communication transceiver chips and clock and data recovery chips. Such phase interpolators are typically operable to combine two phases of a local reference clock signal to form a recovered clock signal which is then used to track the incoming serial data stream. The phase interpolator combines the two phases of the local reference clock according to an interpolation ratio.

The present invention recognizes that this interpolation ratio, which is already conventionally available on transceiver chips or clock and data recovery chips that employ a phase interpolator, can be advantageously used to detect a loss of lock condition after a slip of only a partial cycle. More specifically, the phase deviation in PPM of the recovered clock relative to the local reference clock can be determined by examining the rate of change of the interpolation ratio that is conventionally used by the phase interpolator. In the embodiments of FIG. 1, a logic circuit 21 examines interpolation ratio information 26 over time, in combination with a cycle count CNT of the recovered clock signal 25, which cycle count is provided by a counter 24. The logic at 21 uses the cycle count of the recovered clock to determine a rate of change of the interpolation ratio with respect to the recovered clock signal. If the rate of change of the interpolation ratio exceeds a predetermined threshold rate, then the logic circuit 21 activates a loss of lock signal 22 which indicates that a phase difference between the recovered clock signal and the local reference clock signal exceeds a predetermined amount of permissible phase deviation.

In some exemplary embodiments, the interpolation ratio information is provided as thermometer coded data, as is typical in conventional devices that utilize a phase interpolator. The state of the thermometer coded data indicates the ratio according to which the phase interpolator is to combine two phases of the local reference clock signal. The logic circuitry 21 is enabled for operation when the thermometer coded data assumes its all 0 condition, at which time the logic circuitry outputs a signal RST to reset the counter 24. When the thermometer coded data changes from the all 0 condition, the logic circuit 21 outputs a signal START to the counter 24. In response to the START signal, the counter 24 begins counting cycles of the recovered clock signal. The logic circuit 21 determines whether the thermometer coded data reaches its all 1 condition before the count value CNT reaches a predetermined number, C. If so, this means that the thermometer coded data has moved from its all 0 condition to its all 1 condition in less time than is required for the output count value CNT to reach C, meaning that the rate of change of the interpolation ratio is greater than a threshold rate effectively defined by the value of C. The logic circuit 21 responds to this condition by indicating at 22 that a loss of lock condition exists. Because the thermometer coded data progressed from the all 0 condition to the all 1 condition in less than C cycles of the recovered clock, it is concluded that the rate of change of the interpolation ratio (represented by the thermometer code) with respect to the recovered clock is large enough to compel a conclusion that a loss of lock condition exists. Thus, the target count value C can be set as necessary to provide a desired amount of resolution in the loss of lock determination.

For example, for a 32-bit thermometer code and a ⅛ cycle phase difference between the two phases of the local reference clock that are being combined by the phase interpolator, a transition of the thermometer code from the all 0 state to the all 1 state represents $(^{31}/_{32}) \times (^{1}/_{8})$ cycles, or 0.121 cycles of the local reference clock. If C=600, then the loss of lock detector of FIG. 1 can detect a 0.121 cycle slip in 600 cycles of the recovered clock, which is equivalent to detection of a 1 cycle slip in 4954.8 cycles of the recovered clock, which is in turn equivalent to detection of a 201.8 cycle slip in 1 million cycles of the recovered clock. Thus, a value of C=600 provides a loss of lock detection resolution of 201.8 PPM. Higher values of C will produce lower PPM values (and correspondingly higher resolution), and lower values of C will produce higher PPM values (and correspondingly lower resolution).

If the output count CNT reaches C before the thermometer code reaches the all 1 condition, then no loss of lock condition exists.

The aforementioned exemplary value of C=600 requires the loss of lock detector to include a single 10-bit counter, and the logic 21. As described above, a conventional loss of lock detector having similar performance characteristics would require two 13-bit counters, a phase detector and control circuitry. Thus, loss of lock detectors according to the invention will typically require less circuitry to implement than do conventional detectors, thus requiring a smaller area and less power than conventional loss of lock detectors. Moreover, a loss of lock detector according to the invention can detect a loss of lock condition with a given resolution faster than can conventional detectors, because the loss of lock condition can be detected after only a partial cycle slip (e.g. after a 0.121 cycle slip) rather than after a full cycle slip. An example of the difference in the time required for loss of lock detection is illustrated by the difference between counting 600 recovered clock cycles according to the invention, and counting 5000 recovered clock cycles as in the above-described conventional example.

In some exemplary embodiments, the aforementioned 10-bit counter function is implemented by dividing the recovered clock by 8, and then using the resulting divided clock to clock a 7-bit counter.

Figure 2:
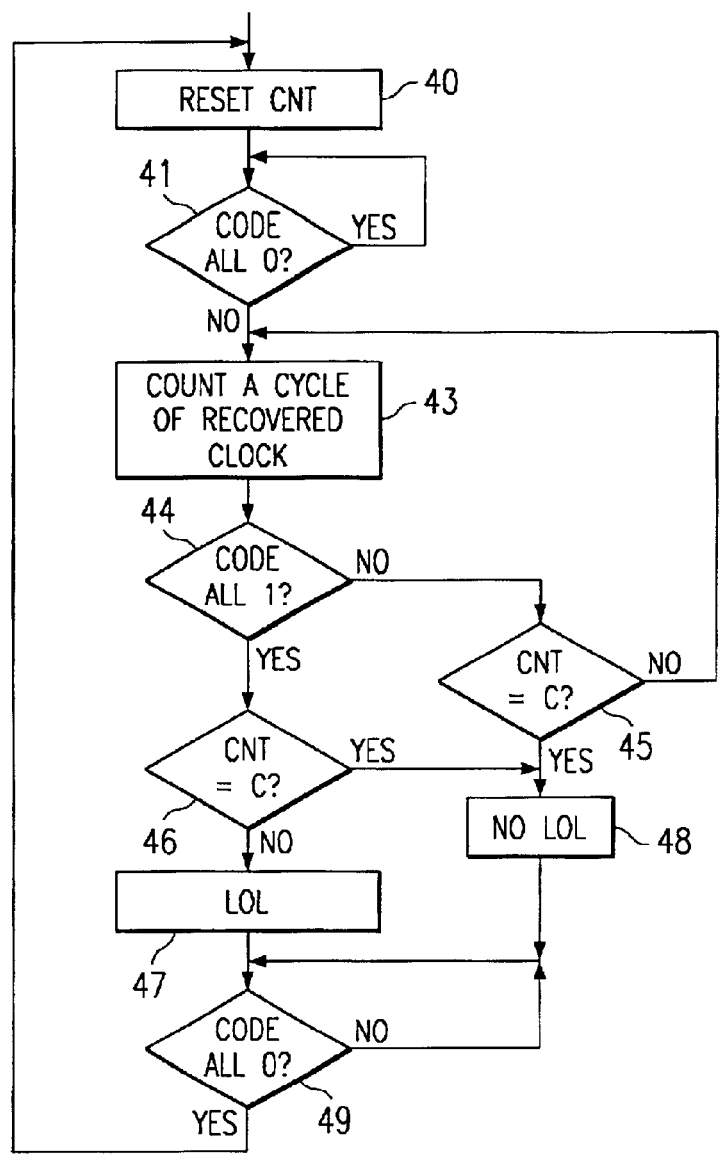
FIG. 2 illustrates exemplary operations which can be performed by the embodiments of FIG. 1.

FIG. 2 illustrates exemplary operations which can be performed by the embodiments of FIG. 1. When the thermometer code leaves its all 0 condition at 41, the count (which was reset at 40) is started at 43, where a cycle of the recovered clock is counted. Thereafter at 44, it is determined whether the thermometer code has assumed its all 1 condition. If not, and if the count value has not reached C at 45, then the next cycle of the recovered clock is counted at 43. If the count value has reached C at 45, then a determination is made at 48 that there is no loss of lock.

If it is determined at 44 that the thermometer code has reached its all 1 condition, it is thereafter determined at 46 whether the count has reached C. If so, then the no loss of lock condition is indicated at 48. However, if the count has not reached C at 46, then a loss of lock condition is indicated at 47. After the loss of lock condition or lack thereof is indicated at 47 or 48, operation of the loss of lock detector is suspended at 49 until the thermometer code again assumes its all 0 condition. When the all 0 condition occurs, the counter is reset at 40, and movement of the thermometer code from the all 0 condition is thereafter awaited at 41.

Although exemplary embodiments of the invention are described above in detail, this does not limit the scope of the invention, which can be practiced in a variety of embodiments.

What is claimed is:

1. A method of evaluating a recovered clock signal that is recovered from a data stream received by a data communication receiver, comprising:

the data communication receiver providing information indicative of a rate of change of an interpolation ratio according to which first and second phases of a local reference clock signal provided by the data communication receiver are combined to form the recovered clock signal; and in response to said rate of change information, determining whether a phase difference between the recovered clock signal and the local reference clock signal exceeds a predetermined amount of phase difference.

2. The method of claim 1, wherein said determining step includes determining whether the rate of change exceeds a predetermined threshold rate, and determining that the phase difference exceeds the predetermined amount of phase difference in response to a determination that the rate of change exceeds the predetermined threshold rate.

3. The method of claim 2, wherein said second-mentioned determining step includes using the recovered clock signal to provide an indication of how much time is required for said interpolation ratio to change by a predetermined amount.

4. The method of claim 3, wherein said using step includes determining whether said interpolation ratio changes by said predetermined amount within a time period defined by an occurrence of a predetermined number of consecutive cycles of the recovered clock signal, said second-mentioned determining step including determining that the rate of change exceeds the predetermined threshold rate if said interpolation ratio changes by said predetermined amount within said time period.

5. The method of claim 1, wherein said rate of change information includes information indicative of changes in said interpolation ratio, and wherein said rate of change information also includes the recovered clock signal.

6. The method of claim 5, wherein said determining step includes using the recovered clock signal and said interpolation ratio change information to determine whether said rate of change exceeds a predetermined threshold rate, and determining that said phase difference exceeds said predetermined amount of phase difference in response to a determination that said rate of change exceeds the predetermined threshold rate.

7. The method of claim 6, wherein said providing step includes the data communication receiver providing said interpolation ratio change information as thermometer coded data.

8. The method of claim 7, wherein said using step includes using the recovered clock signal to provide an indication of how much time is required for said thermometer coded data to change from a first value to a second value.

9. The method of claim 8, wherein said first value is an all 0 value and said second value is an all 1 value.

10. The method of claim 8, wherein said last-mentioned using step includes determining whether said thermometer coded data changes from said first value to said second value within a time period defined by an occurrence of a predetermined number of consecutive cycles of the recovered clock signal.

11. The method of claim 10, wherein said first value is an all 0 value and said second value is an all 1 value.

12. An apparatus for evaluating a recovered clock signal that a data communication receiver recovers from a data stream received by the data communication receiver, comprising:

an input for receiving information that is provided by the data communication receiver and is indicative of a rate of change of an interpolation ratio according to which first and second phases of a local reference clock signal provided by the data communication receiver are combined to form the recovered clock signal; and circuitry coupled to said input and responsive to said rate of change information for determining whether a phase difference between the recovered clock signal and the local reference clock signal exceeds a predetermined amount of phase difference.

13. The apparatus of claim 12, wherein said rate of change information includes information indicative of changes in said interpolation ratio, and wherein said rate of change information also includes the recovered clock signal.

14. The apparatus of claim 13, wherein said circuitry is responsive to the recovered clock signal and said interpolation ratio change information for determining whether said rate of change exceeds a predetermined threshold rate, said circuitry further responsive to a determination that said rate of change exceeds the predetermined threshold rate for determining that said phase difference exceeds said predetermined amount of phase difference.

15. The apparatus of claim 14, wherein said interpolation ratio change information includes thermometer coded data.

16. The apparatus of claim 15, wherein said circuitry includes a counter coupled to said input, and a logic circuit coupled to said input and said counter, said counter responsive to the recovered clock signal for providing to said logic circuit an indication of elapsed time, said logic circuit responsive to said indication for evaluating how much time is required for said thermometer coded data to change from a first value to a second value and thereby producing an indication of said rate of change.

17. The apparatus of claim 16, wherein said first value is an all 0 value and said second value is an all 1 value.

18. The apparatus of claim 16, wherein said counter includes an output coupled to said logic circuit for providing thereto a cycle count of the recovered clock signal, said logic circuit responsive to said cycle count and said thermometer coded data for determining whether said thermometer coded data changes from said first value to said second value within a time period defined by an occurrence of a predetermined number of consecutive cycles of the recovered clock signal, said predetermined number of consecutive cycles corresponding to the predetermined threshold rate.

19. The apparatus of claim 13, wherein said circuitry includes a counter coupled to said input and responsive to the recovered clock signal for providing an indication of elapsed time, and a logic circuit coupled to said counter and said input, said logic circuit responsive to said indication for evaluating how much time is required for said interpolation ratio to change by a predetermined amount.

20. The apparatus of claim 12, provided in the data communication receiver, and wherein the data communication receiver is one of a data communication transceiver chip and a clock and data recovery chip.

* * * * *